US011427905B2

(12) United States Patent
Lowrey (10) Patent No.: US 11,427,905 B2
(45) Date of Patent: Aug. 30, 2022

(54) CONTROLLED VARIABLE THICKNESS FILM DEPOSITION ON A NON-FLAT SUBSTRATE FOR HIGH VOLUME MANUFACTURING

(71) Applicant: Tyler A. Lowrey, Hamilton, MT (US)

(72) Inventor: Tyler A. Lowrey, Hamilton, MT (US)

(73) Assignee: Innoven Energy LLC, Colorado Springs, CO (US)

( * ) Notice: Subject to any disclaimer, the term of this patent is extended or adjusted under 35 U.S.C. 154(b) by 24 days.

(21) Appl. No.: 16/365,937

(22) Filed: Mar. 27, 2019

(65) Prior Publication Data

US 2020/0308694 A1    Oct. 1, 2020

(51) Int. Cl.
*C23C 14/54*    (2006.01)
*C23C 14/50*    (2006.01)
*C23C 14/34*    (2006.01)

(52) U.S. Cl.
CPC ............ *C23C 14/542* (2013.01); *C23C 14/34* (2013.01); *C23C 14/505* (2013.01)

(58) Field of Classification Search
CPC ...... C23C 14/542; C23C 14/505; C23C 14/34
USPC .................................................... 204/298.03
See application file for complete search history.

(56) References Cited

U.S. PATENT DOCUMENTS

| 5,098,483 A | * | 3/1992 | Little | C23C 16/458 423/497 |
| 5,225,057 A | | 7/1993 | Lefebvre | |
| 5,798,027 A | * | 8/1998 | Lefebvre | C23C 8/02 204/192.26 |
| 6,231,732 B1 | | 5/2001 | Hollars | |
| 2005/0067290 A1 | * | 3/2005 | Bonkass | C25D 21/12 205/84 |
| 2013/0075246 A1 | * | 3/2013 | Ge | C23C 14/584 204/192.15 |
| 2016/0093477 A1 | * | 3/2016 | Rogers | H01J 37/3423 427/569 |
| 2019/0057780 A1 | | 2/2019 | Hunter | |

FOREIGN PATENT DOCUMENTS

CN    1414135 A   *   4/2003
CN   105349958 A   *   2/2016

OTHER PUBLICATIONS

CN-1414135-A Translation (Year: 2003).*
CN-105349958-A Translation (Year: 2016).*

* cited by examiner

*Primary Examiner* — Jennifer Wecker
*Assistant Examiner* — Patrick S Ott (57) ABSTRACT

A system and method for controllably varying the thickness of film deposition on a spherical or other non-flat substrate during high volume manufacturing is described. A gripping X-Y transfer stage rotates a substrate in-situ in a direction film deposition chamber. The transfer stage is driven at variable speeds to realize a desired distribution of film thickness variation around the surface of the substrate. Spatial variations in disposition thickness can be smoothly and continuously variable or abruptly changed.

16 Claims, 6 Drawing Sheets

CONTROLLED VARIABLE THICKNESS FILM DEPOSITION ON A NON-FLAT SUBSTRATE FOR HIGH VOLUME MANUFACTURING

CROSS-REFERENCE TO RELATED APPLICATIONS

This application claims the benefit of U.S. Provisional Application No. 62/652,160 filed on Apr. 3, 2018, which is incorporated herein by reference.

BACKGROUND

Figure 1:
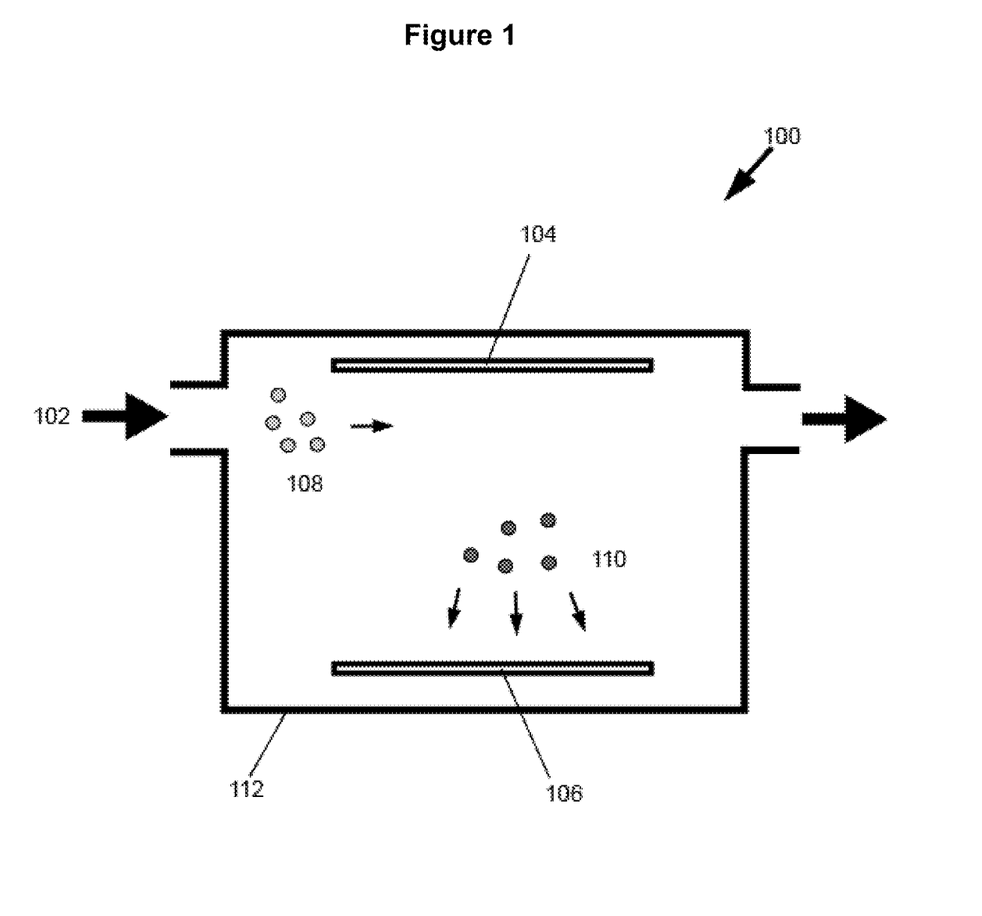
FIG. 1 shows a conventional sputter deposition chamber.

FIG. 1 shows an example of a standard directional sputter film deposition system 100 used in many applications including microelectronics fabrication. A sputtering target 104, which acts as one electrode, is mounted in the system that consists of the material 110 desired to be deposited on a substrate 106. A substrate 106 where the film deposition is desired is placed in the grounded chamber 112 at an opposite electrode. The chamber is then pumped down to low pressure and a sputter gas 102 is introduced, typically Argon gas (Ar). An electrical voltage stimulus is applied between the upper and lower electrode that is composed of a high frequency component (usually in the MHz range) and optionally a low and/or DC component. This strikes a plasma, stripping electrons from the sputter gas and creating ions (Ar+) 108. These ions are accelerated towards the sputtering target 104, hit the target, and knock off atoms 110 of the desired deposition material, some of which land on the substrate 106. The deposition continues until the desired thickness is achieved, then terminated.

These systems are generally designed for uniform deposition on a flat substrate wafer, such as for semiconductor microelectronics applications. However, for other applications, such as Inertial Confinement Fusion (ICF), it is desirable to deposit specifically desired variable thickness films on non-flat substrates, including spherical substrates, such as may be used for ICF targets. The present invention provides a means to achieve this.

Unless otherwise indicated herein, the materials described in this section are not prior art to the claims in this application and are not admitted to be prior art by inclusion in this section.

SUMMARY OF THE INVENTION

Accordingly, it is an object of the present invention to provide a high-volume manufacturing compatible tool for sputter deposition on spherical or other non-flat substrates. This allows for simultaneous deposition of a large number of small non-flat substrates such as required, for example, for ICF targets, increasing manufacturing capacity and greatly decreasing unit cost. The present invention enables many advantages including the following. Deposition of a wide variety of materials (essentially all solids) in a continuous smooth film around the full surface of a non-flat substrate is enabled by this invention and is highly desirable. Also, deposition of a wide variety of patterns of intentional film thickness variations on a substrate is desirable for ICF and other applications and is achieved with this invention. Rotation also improves the uniformity when the user so desires.

A gripping X-Y transfer stage rotates a substrate in-situ in a directional film deposition chamber such as a sputter deposition chamber or E-beam deposition chamber. The transfer stage is driven at variable speeds to realize a desired distribution of film thickness variation around the surface of the substrate. Spatial variations in deposition thickness can be smoothly and continuously variable or abruptly changed.

| REFERENCE NUMERALS | |
| --- | --- |
| 100 | Directional Sputter Film Deposition System |
| 102 | Sputtering Gas |
| 104 | Sputtering Target |
| 106 | Substrate and Film Growth |
| 108 | Ar+ Ions |
| 110 | Atoms Sputtered Toward Substrate |
| 112 | Chamber |
| 200 | Deposition Stage/Electrode |
| 202 | X-Y Transfer Stage |
| 204 | Seating Layer Lift |
| 206 | Seating Layer |
| 208 | Seating Holes |
| 210 | Substrate |
| 212 | X-Y Transfer Stage Top Surface |
| 214 | Material Deposition |
| 216 | X Stepping Motor |
| 218 | Y Stepping Motor |
| 220 | Z Stepping Motor |
| 302 | Distance (5) between Seating Layer and X-Y Transfer Stage Surface |
| 304 | Pins |
| 402 | Contact Points |
| 602 | Directional Film Deposition Profile |

DETAILED DESCRIPTION

Figure 2:
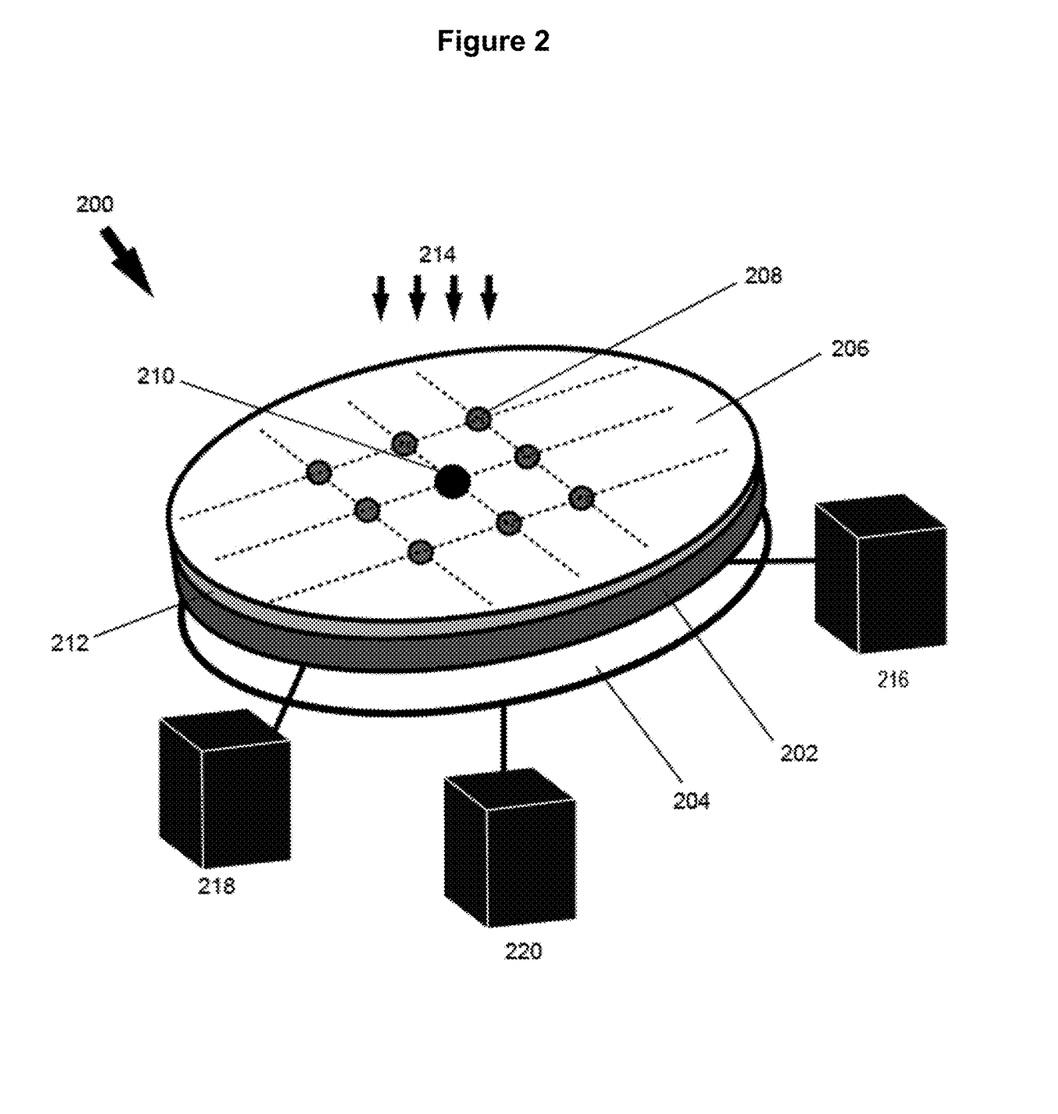
FIG. 2 shows a deposition stage/electrode of the present invention.

FIG. 2 shows the deposition stage/electrode 200 of the present invention. It is composed of 3 levels, the seating layer 206, X-Y transfer stage 202, and seating layer lift 204. In one embodiment, the seating layer 206 is a thin circular disk disposed above the X-Y transfer stage. This space between 206 and 202 is adjustable, for example, by positioning of a seating layer lift 204 controlled by the seating layer lift 204 and vertical stepper motor 220. The seating layer has an array of holes 208 disposed throughout its X-Y directions. Here a plurality of substrates 210 can be placed in preparation for deposition. Spherical substrates are shown in FIG. 2, but it should be noted that any non-flat substrate may be used.

Figure 4A:
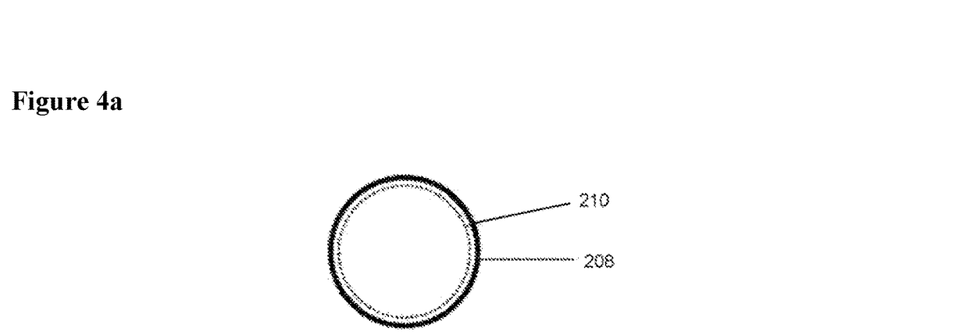
FIGS. 4a-c show various possible shapes and relative sizes of spherical substrates and seating layer holes.

In one embodiment, the seating holes 208 will have a diameter smaller than the spheres 210 and all the spheres will sit on these holes (see FIG. 4a). In other embodiments, the hole diameters will be greater than the sphere diameters and the spheres will be sitting on top of the X-Y Transfer Stage Top Surface 212 with the edges of the seating layer holes 208 surrounding each sphere 210 in close proximity (see FIG. 4b). In still other embodiments, the hole diameters will be greater than the sphere diameters, but contact points 402 (FIG. 4c) be added at various places around the hole to provide positioning for the spheres. In another optional embodiment, the seating layer 206 can be used as a carrier to load and unload the deposition run.

The X-Y transfer stage top surface 212 may be milled to have a rough surface. In one embodiment, the surface is raspy, similar to a metal file with X and Y grooves where the groove pitch is much smaller than the sphere diameter. The top protrusions of this surface making contact with the spherical substrate will have smoothed edges to avoid scoring the sphere during rotation. The sphere will rest in the grooves. This allows the X-Y transfer stage to grip the spheres and rotate them during an X-Y transfer. The seating layer will prevent the spheres from transferring laterally and allow for their rotation. The inner hole edges of the seating layer will be blunt to avoid any scoring of the spherical substrate during rotation.

Figure 3:
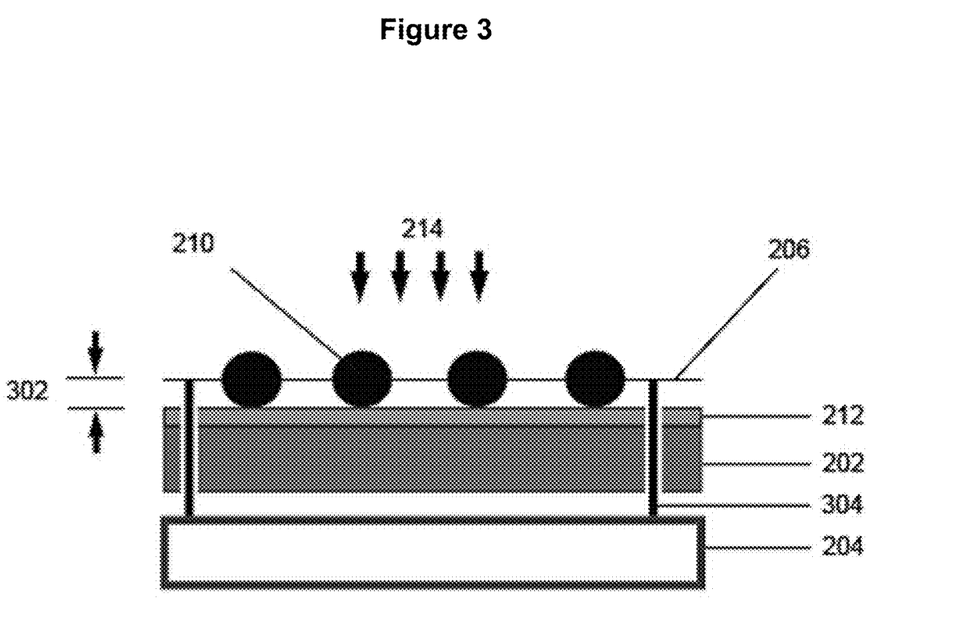
FIG. 3 shows a cross section of the stage and seating layer loaded with a plurality of spherical substrates.

FIG. 3 shows a cross-section of the X-Y transfer stage 202, seating layer lift 204, and seating layer 206 loaded with spherical substrates 210. The spheres rest on the holes in the seating layer and on the rough surface 212 of the X-Y transfer stage, in one embodiment, the height 302 of the seating layer 206 above the X-Y transfer stage 202 is adjusted by a vertical positioning stepper motor 220. Moving pins 304 extending through holes around the outside perimeter of the X-Y transfer stage 202 can move up and down using the seating layer lift 204.

Figure 4B:
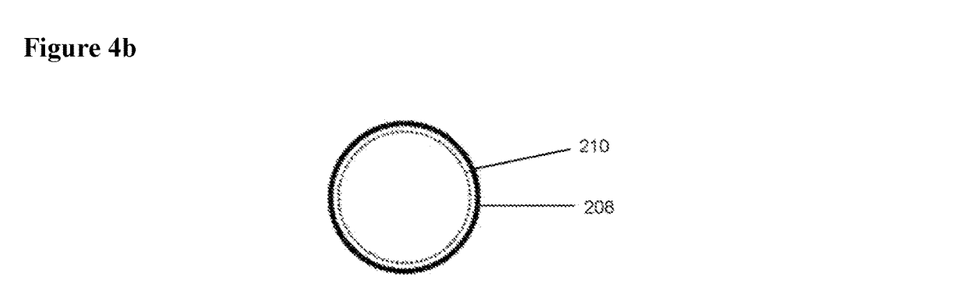
Figure 4C:
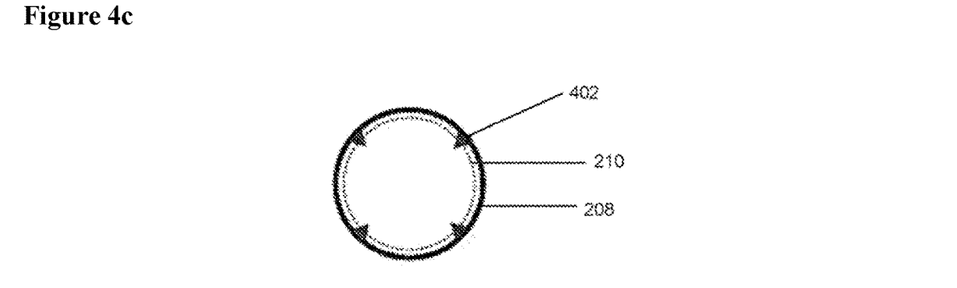

FIGS. 4*a-c* shows some various options for the relative size and shapes of the spherical substrate 210 relative to the seating layer hole 208. D is the diameter of the spherical substrate 210 and H is the diameter of the seating layer hole 208. FIG. 4*a* shows the case with D>H. The sphere rests on the hole while also contacting the rough surface of the X-Y transfer stage 202 (not shown). As the transfer stage moves, each sphere is rotated accordingly. For a linear Δx-Δy transfer, the distance Δp of the X-Y transfer stage is given by:

$$\Delta p = \sqrt{(\Delta x^2 + \Delta y^2)}$$

The sphere is rotated by an angle Y according to the following expression:

$$Y = 360 \times \frac{\Delta p}{(\pi * D)}$$

The rotation of the sphere is around an axis that is parallel to the X-Y transfer stage surface and orthogonal to the vector defined by the Δp transfer.

FIG. 4*b* shows the case with D<H. In this case the spherical substrate 210 rests on the transfer stage 202 (not shown). The sphere does not rotate until Δp is sufficient for the sphere to contact the hole edge of the seating layer. This initial Δp, $\Delta p_i$ would be in the range of:

$$0 \leq \Delta p_i < (H-D)$$

This adds an unknown variable to the final rotation amount, but this case reduces the friction of the sphere contacting the seating layer by greatly reducing the contact area. The unknown angular shift amount can be designed by choice of H−D, trading off accuracy of deposition placement with ease of rotation, if needed.

FIG. 4*c* shows the case of D<H with 4 contact points 402. However, any number of contact points may be used, such as 3 or greater, preferably positioned at equal angular distance around the circle. In this case friction is minimized while eliminating the $\Delta p_i$ rotation uncertainly discussed above. The tips of the contact points will be blunt to avoid any scoring of the spherical substrate during rotation.

In one embodiment, the deposition recipe can be written in such a way that static depositions (no rotation) are performed followed by a user desired rotation without deposition and so forth sequentially (i.e., static deposition—rotation—static deposition—rotation). For this sequential approach, it is possible to add a step that moves the seating layer lift down slightly vertically between the static deposition and rotation steps which lifts the sphere off their retaining holes (cases shown in FIGS. 4*a* and 4*c*). Then, like the case shown in FIG. 4*b*, a stage translation is done to invoke the rotation with minimal contact between sphere and seating layer. Then the seating layer lift is moved back up, placing the spheres in their respective holes and a static (or dynamic with rotation) deposition can proceed again.

Figure 5:
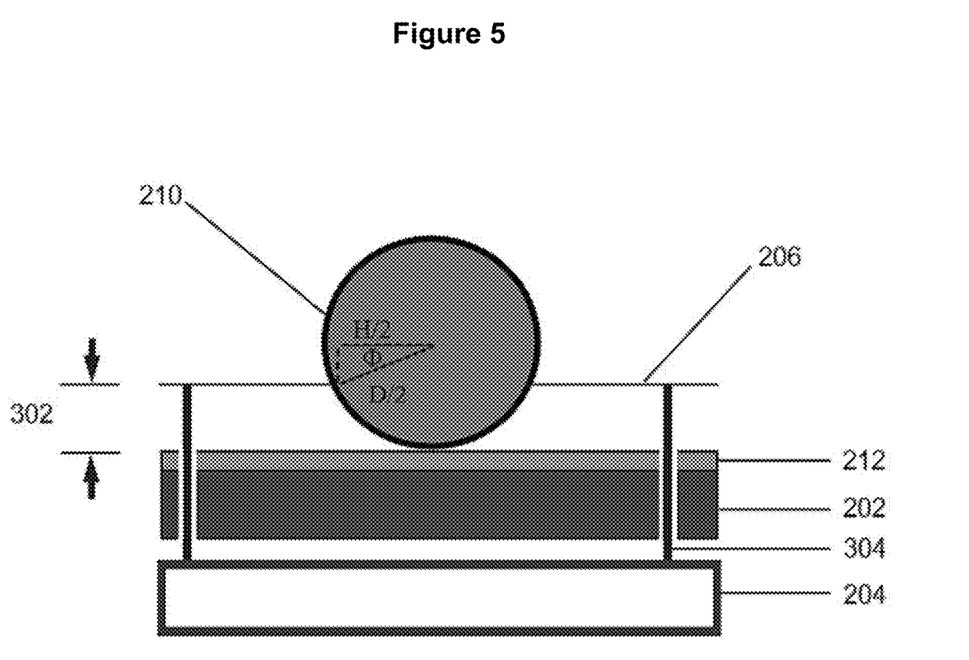
FIG. 5 shows a close-up of a seated spherical substrate.

FIG. 5 shows a close-up of a seated spherical substrate 210. For the case of D>H (FIG. 4*a*), we can derive the required height 302 of the seating layer 206 above the X-Y transfer stage 202, represented as S, as a function of D and H as follows:

$$\cos\phi = \frac{\left(\frac{H}{2}\right)}{\left(\frac{D}{2}\right)} = \frac{H}{D}$$

$$\sin\phi = \frac{\left(\frac{D}{2} - s\right)}{\left(\frac{D}{2}\right)} = 1 - 2 \times \frac{S}{D}$$

$$\cos^2\phi + \sin^2\phi = 1$$

$$\sin\phi = \sqrt{(1 - \cos^2\phi)} = \sqrt{\left(1 - \frac{H^2}{D^2}\right)} = 1 - 2 \times \frac{S}{D}$$

$$1 - \frac{H^2}{D^2} = 1 - 4 \times \frac{S}{D} + 4 \times \frac{S^2}{D^2}$$

$$S^2 - S \times D + \frac{H^2}{4} = 0$$

$$S = \frac{(D \pm \sqrt{(D^2 - H^2)})}{2}$$

$$S = \frac{(D - \sqrt{(D^2 - H^2)})}{2} \quad \left(\text{since } S < \frac{D}{2}\right)$$

Thus, S is a function of D. Further, D will be increasing with time as deposition proceeds. Therefore, S must be adjustable. The proper spacing S (302, FIG. 5) can be maintained with a z-axis positioner for the seating layer lift 204 such as a stepper motor 220 (FIG. 2). Note the above expressions also apply to the case shown in FIG. 4*c*), with H now being the effective hole diameter defined by a circle that circumscribes the contact points. Thus, the vertical position of the seating layer lift 204 will need to be adjusted upward as deposition proceeds commensurate with the deposition rate as part of the programmed recipe.

Figure 6:
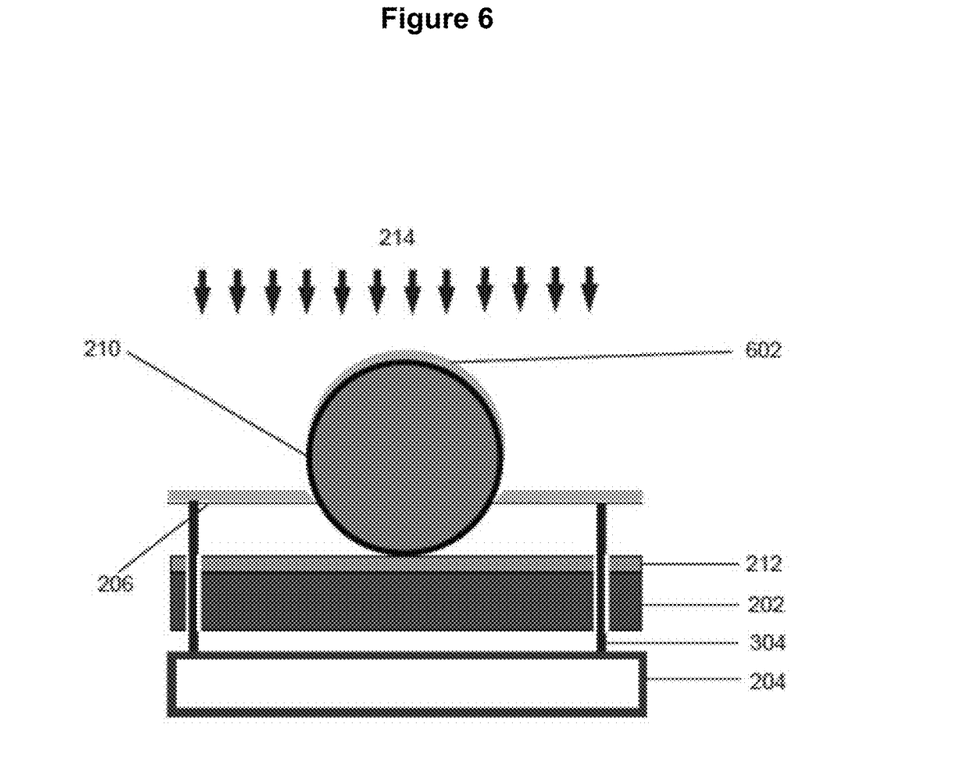
FIG. 6 shows a directional deposition profile.

One area of concern exists for the static case or slow rotation case where no or slow rotation is being done during a portion of the deposition process. There is a potential for deposited material to glue the sphere to the retaining seating layer hole edge at a contact point and prevent additional rotation. However, this issue is avoided due to the use of vertical directional deposition. With the directional deposition (e.g. sputter or E-beam), the downward rainfall will be shadowed by the lateral extent of the sphere before material gets to the contacting ring or point. FIG. 6 shows an anticipated static deposition profile (no rotation) 602 at these points. Note, for extra insurance for this case, a collimator can be added to further increase the deposition vertical directionality.

This invention is compatible with high volume manufacturing as industry standard large sputter deposition chambers can be modified with stages and seating layers that are greater than 300 mm in diameter. This allows for simultaneous deposition of a large number of spherical substrates, increasing manufacturing capacity and greatly decreasing unit cost. For a circular deposition chamber with stage and seating layer diameter C and substrate sphere of final deposition diameter D and final deposition space Sp, the number of spherical substrates per deposition (N) is calculated as follows:

$$N = \pi \frac{\left(\frac{C}{2}\right)^2}{(D+Sp)^2}$$

$$N = \frac{\pi}{4} \times \frac{C^2}{(D+Sp)^2}$$

For C=300 mm, mm, and Sp=0.5 mm:

$$N = \frac{\pi}{4} \times \frac{300^2}{(3.5+0.5)^2} = 4,417$$

This is a key factor for many applications including ICF, since the cost is critical and thick film depositions may be required that have a long deposition.

As is known in the art, the seating layer can be removed from the tool periodically and etched to remove previously deposited films, cleaned, and readied for re-use. Also, note that each deposition run can be customized for a given starting substrate (i.e., spherical diameter) by swapping in/out an appropriately tooled seating layer and running the appropriate deposition program recipe.

To those familiar with the state of the art, it should be clear that the concepts of this invention can also be used with multi-target sputter systems to provide for deposition of perhaps 3 or more different film materials in a single pump down. This allows for lamination in a uniform or non-uniform manner on a sphere in a pattern as desired. Further, it should be clear that the concepts of this invention can also be used with multi-gun/multi-target sputter systems to provide for deposition of perhaps 3 or more different materials simultaneously to provide for unique materials or grading the stoichiometry of a material system through the deposition profile in a uniform or non-uniform manner on a sphere in a pattern as desired.

Other options related to conventional sputtering such as reactive sputtering, magnetron sputtering, substrate temperature heating or cooling, and variable bias sputtering remain available simultaneously with use of this invention.

In "Reflectivity Variation of Kit Target Surfaces," patent pending by R. O. Hunter, Jr. and Adlai H. Smith, submitted Jun. 8, 2018, patent Ser. No. 16/003,885, and incorporated by reference, Innoven has outlined a new system and method for spatially varying the reflectivity on a target or hohlraum surface in ICF applications. In other aspects of that invention, volume absorbers embedded within the hohlraum wall can have their absorptivity varied to compensate for hohlraum geometry and source intensity. This patent provides a high volume manufacturing compatible means of achieving such spatially varying reflectivity and volume absorbers. There are potentially many other applications for the inventions described herein in many other areas.

The set of embodiments discussed in this application is intended to be exemplary only, and not an exhaustive list of all possible variants of the invention. Certain features discussed as part of separate embodiments may be combined into a single embodiment. Additionally, embodiments may make use of various features known in the art but not specified explicitly in this application.

Embodiments can be scaled-up and scaled-down in size, and relative proportions of components within embodiments can be changed as well. The range of values of any parameter (e.g. size, thickness, density, mass, etc.) of any component of an embodiment of this invention, or of entire embodiments, spanned by the exemplary embodiments in this application should not be construed as a limit on the maximum or minimum value of that parameter for other embodiments, unless specifically described as such.

The invention claimed is:

1. A system for simultaneous deposition on a plurality of non-flat substrates while varying a thickness of film deposition on the non-flat substrates, comprising:
   a X-Y transfer stage to receive a seating layer;
   said seating layer comprises a plurality of seating holes;
   said seating holes receive a plurality of non-flat substrates;
   a X stepper motor and Y stepper motor to control rotation and positioning of the X-Y transfer stage;
   a seating layer lift to adjust the positioning of the seating layer;
   a Z stepper motor to control the positioning of the seating layer with respect to the X-Y transfer stage; and
   a film deposition station to deposit a film having a thickness upon the plurality of non-flat substrates and configured to continuously control the thickness of the film deposition as the X stepper motor and the Y stepper motor control the rotation and positioning of the X-Y transfer stage and the Z stepper motor controls the positioning of the seating layer with respect to the X-Y transfer stage; and
   the film deposition station further configured to produce a number of non-flat substrates per deposition (N) according to N=

$$N = \frac{\pi}{4} \times \frac{C^2}{(D+Sp)^2},$$

wherein C is a diameter of the seating layer, D is a diameter of each of the plurality of non-flat substrates at the end of the deposition and Sp is a space between the seating layer and the X-Y transfer stage at the end of the deposition.

2. The system of claim 1, wherein the top surface of said X-Y transfer stage is a milled rough surface.

3. The system of claim 1, wherein any protrusions from the top surface of said X-Y transfer stage are polished smooth to avoid scoring the non-flat substrate during rotation.

4. The system of claim 1, wherein a diameter of each of the plurality of seating holes is smaller than a diameter of each of the plurality of non-flat substrates.

5. The system of claim 1, wherein a diameter of each of the plurality of seating holes is larger than a diameter of each of the plurality of non-flat substrates.

6. The system of claim 5, further comprising three or more contact points equally spaced around each of the plurality of seating holes, wherein said three or more contact points provide positioning for each of the plurality of non-flat substrates.

7. The system of claim 1, wherein the plurality of non-flat substrates are spherical substrates.

8. The system of claim 1, wherein said spacing between the seating layer and the X-Y transfer stage top surface is adjusted using perimeter pins and said seating layer lift.

9. A method for simultaneous depositing a film having a thickness by varying the thickness of film deposition on a plurality of non-flat substrates, comprising:
- placing the plurality of non-flat substrates within a plurality of seating holes;
- wherein said seating holes are located within a seating layer;
- placing said seating layer upon a X-Y transfer stage;
- controlling the rotation and positioning of said X-Y transfer stage;
- placing a seating layer lift below said X-Y transfer stage to adjust the position of said seating layer;
- controlling the spacing between said seating layer and said X-Y transfer stage;
- continuously controlling a thickness profile on said plurality of non-flat substrates while continuously controlling the rotation, positioning and spacing between said seating layer and said X-Y transfer stage top surface; and
- producing a number of non-flat substrates per deposition (N) according to N=

$$N = \frac{\pi}{4} \times \frac{C^2}{(D+Sp)^2},$$

wherein C is a diameter of the seating layer, D is a diameter of each of the plurality of non-flat substrates at the end of the deposition and Sp is a space between the seating layer and the X-Y transfer stage at the end of the deposition.

10. The method of claim 9, further comprising milling the top surface of said X-Y stage to have a milled rough surface.

11. The method of claim 9, further comprising polishing and smoothing any protrusions from the top surface of said X-Y stage to avoid scoring the non-flat substrate during rotation.

12. The method of claim 9, wherein a diameter of each of the plurality of seating holes is smaller than a diameter of each of the plurality of non-flat substrates.

13. The method of claim 9, wherein a diameter of each of the plurality of seating holes is larger than a diameter of each of the plurality of non-flat substrates.

14. The method of claim 13, further comprising using three or more contact points equally spaced around each of the plurality of seating holes to provide positioning for each of the plurality of non-flat substrates.

15. The method of claim 9, wherein the plurality of non-flat substrates are spherical substrates.

16. The method of claim 9, wherein said spacing between the seating layer and the X-Y transfer stage top surface is adjusted using perimeter pins and the seating layer lift.

* * * * *